US011004751B2

(12) United States Patent
Cheng et al.

(10) Patent No.: US 11,004,751 B2
(45) Date of Patent: May 11, 2021

(54) VERTICAL TRANSISTOR HAVING REDUCED EDGE FIN VARIATION

(71) Applicant: International Business Machines Corporation, Armonk, NY (US)

(72) Inventors: Kangguo Cheng, Schenectady, NY (US); Juntao Li, Cohoes, NY (US); Dexin Kong, Guilderland, NY (US); Zhenxing Bi, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/284,261

(22) Filed: Feb. 25, 2019

(65) Prior Publication Data
US 2020/0273756 A1    Aug. 27, 2020

(51) Int. Cl.
| | | |
|---|---|---|
| H01L 21/8234 | (2006.01) | |
| H01L 21/762 | (2006.01) | |
| H01L 29/66 | (2006.01) | |
| H01L 27/088 | (2006.01) | |
| H01L 21/311 | (2006.01) | |
| H01L 29/06 | (2006.01) | |
| H01L 21/308 | (2006.01) | |
| H01L 21/3065 | (2006.01) | |

(52) U.S. Cl.
CPC ........ *H01L 21/823481* (2013.01); *H01L 21/76224* (2013.01); *H01L 27/088* (2013.01); *H01L 29/66666* (2013.01); *H01L 21/3065* (2013.01); *H01L 21/3083* (2013.01); *H01L 21/31111* (2013.01); *H01L 29/0653* (2013.01)

(58) Field of Classification Search
CPC ............ H01L 27/088; H01L 29/66666; H01L 29/0653; H01L 21/823481; H01L 21/76224; H01L 21/3083; H01L 21/31111; H01L 21/3065
USPC .............. 257/308, 401, 506, 446, 510, 623, 257/E27.112, E29.02, E21.006, E21.014, 257/E21.027, E21.058, E21.409, E21.546; 438/296, 427, 443, 700, 745
See application file for complete search history.

(56) References Cited

U.S. PATENT DOCUMENTS

| | | | |
|---|---|---|---|
| 8,431,466 B2 | 4/2013 | Lin et al. | |
| 8,895,446 B2* | 11/2014 | Peng | H01L 21/76224 438/700 |
| 9,564,369 B1* | 2/2017 | Kim | H01L 21/823431 |
| 9,805,935 B2 | 10/2017 | Anderson et al. | |
| 9,805,987 B2 | 10/2017 | Basker et al. | |
| 9,837,410 B1 | 12/2017 | Cheng et al. | |
| 9,899,388 B2* | 2/2018 | Kim | H01L 21/823821 |
| 10,128,240 B2* | 11/2018 | Min | H01L 21/823481 |

(Continued)

*Primary Examiner* — Dao H Nguyen
(74) *Attorney, Agent, or Firm* — Cantor Colburn LLP; Douglas Pearson

(57) ABSTRACT

A semiconductor device includes a substrate with a first semiconductor fin and a second semiconductor fin formed thereon. A pair of opposing dielectric trench spacers are between the first and second semiconductor fins. The opposing dielectric trench spacers define an isolation region therebetween. The semiconductor device further includes a shallow trench isolation (STI) element formed in the isolation region. The STI element includes a lower portion on the substrate and an upper portion located opposite the lower portion. The upper portion extends above an upper end of the dielectric trench spacers.

6 Claims, 17 Drawing Sheets

(56) References Cited

U.S. PATENT DOCUMENTS

| | | | |
|---|---|---|---|
| 10,529,801 B2* | 1/2020 | Sun | H01L 27/0886 |
| 10,692,781 B2* | 6/2020 | Kim | H01L 29/0653 |
| 2014/0227857 A1* | 8/2014 | Youn | H01L 21/823481 |
| | | | 438/427 |
| 2015/0021710 A1* | 1/2015 | Hsu | H01L 21/76224 |
| | | | 257/401 |
| 2015/0214341 A1* | 7/2015 | Shin | H01L 29/7851 |
| | | | 257/401 |
| 2015/0295005 A1* | 10/2015 | Tseng | H01L 27/14632 |
| | | | 257/446 |
| 2017/0154823 A1* | 6/2017 | Tseng | H01L 21/823431 |
| 2018/0040694 A1* | 2/2018 | Tseng | H01L 21/823431 |
| 2018/0040713 A1 | 2/2018 | Chang et al. | |
| 2018/0090491 A1 | 3/2018 | Huang et al. | |
| 2019/0326287 A1* | 10/2019 | Liaw | H01L 27/0207 |

* cited by examiner

US 11,004,751 B2

VERTICAL TRANSISTOR HAVING REDUCED EDGE FIN VARIATION

BACKGROUND

The present invention relates in general to fabrication methods and resulting structures for semiconductor devices. More specifically, the present invention relates to fabrication methods and resulting structures for forming vertical-type field effect transistors (VFETs).

Semiconductor devices are typically formed using active regions of a wafer. In an integrated circuit (IC) having a plurality of metal oxide semiconductor field effect transistors (MOSFETs), each MOSFET has a source and a drain that are formed in an active region of a semiconductor layer by implanting n-type or p-type impurities in the layer of semiconductor material. A conventional geometry for MOSFETs is known as a planar device geometry in which the various parts of the MOSFET device are laid down as planes or layers.

Semiconductor design has recently shifted toward non-planar FETs, which allow for increasing the contact area of the channel region. One type of non-planar FET is known generally as a vertical FET (VFET). VFETs employ fin-shaped channels surrounded by gate structures resulting in increased device density and increased performance over lateral devices. In VFETs, the source to drain current flows through the fin-shaped channel in a direction that is perpendicular to a major surface of the substrate. For example, in a known VFET configuration a major substrate surface is horizontal and the fin-shaped channel extends vertically upward from the substrate surface. A source region and a drain region are situated in electrical contact with the top and bottom ends of the fin-shaped channel region.

SUMMARY

According to a non-limiting embodiment of the present invention, a semiconductor device includes a substrate with a first semiconductor fin and a second semiconductor fin formed thereon. A pair of opposing dielectric trench spacers are between the first and second semiconductor fins. The opposing dielectric trench spacers define an isolation region therebetween. The semiconductor device further includes a shallow trench isolation (STI) element formed in the isolation region. The STI element includes a lower portion on the substrate and an upper portion located opposite the lower portion. The upper portion extends above an upper end of the dielectric trench spacers.

According to another non-limiting embodiment, a semiconductor device comprises a substrate including a first semiconductor fin and a second semiconductor fin separated from the first semiconductor fin by an isolation region. A pair of opposing dielectric trench spacers are formed in a portion of the substrate located in the isolation region between the first and second semiconductor fins. A shallow trench isolation (STI) element is formed in the isolation region. The STI element includes an upper surface that extends no higher than an upper end of the opposing dielectric trench spacers.

According to yet another non-limiting embodiment, a method of fabricating a semiconductor device comprises forming a first semiconductor fin and a second semiconductor fin on a substrate, and forming a pair of opposing dielectric trench spacers between the first and second semiconductor fins to define an isolation region therebetween. The method further comprises forming a shallow trench isolation (STI) element in the isolation region and between the opposing dielectric trench spacers.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
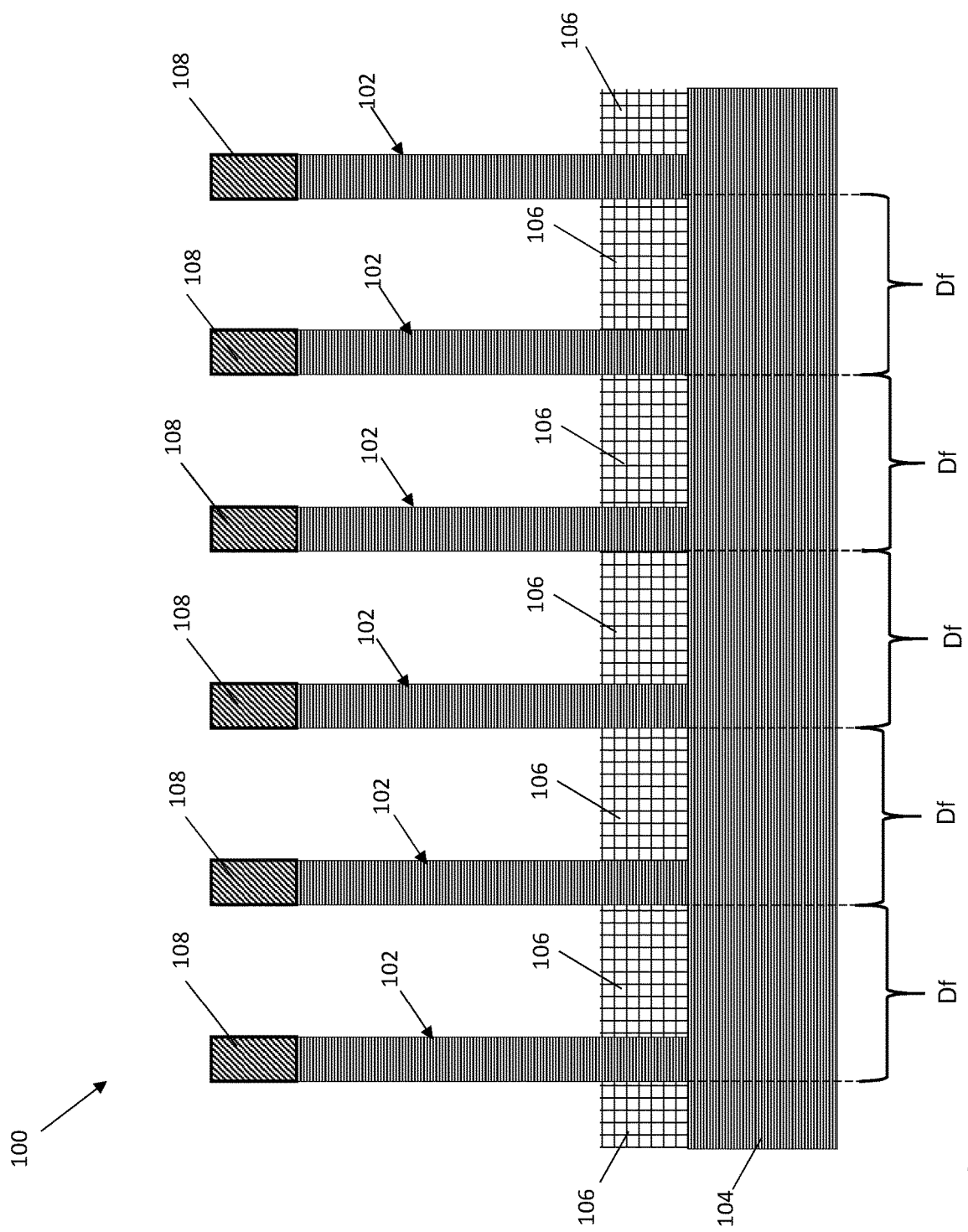
FIG. 1 depicts a semiconductor device following various intermediate fabrications processes according to a non-limiting embodiment of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

It is understood in advance that, although this description includes a detailed description of the formation and resulting structures for a specific type of VFET, implementation of the teachings recited herein are not limited to a particular type of VFET or IC architecture. Rather embodiments of the present invention are capable of being implemented in conjunction with any other type of VFET or IC architecture, now known or later developed.

Various embodiments of the present invention are described herein with reference to the related drawings. Alternative embodiments of the present invention can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched and the second element can act as an etch stop.

Turning now to an overview of technologies that are more specifically relevant to aspects of the invention, complementary metal-oxide-semiconductor (CMOS) semiconductor devices implement one or more n-channel metal-oxide semiconductor (NMOS) transistors that are located adjacent to one or more p-channel metal-oxide semiconductor (PMOS) transistors. Shallow trench isolation (STI) elements are typically included in the CMOS device to prevent electric current leakage between adjacent NMOS and PMOS transistors. The STI element formation process generally involves etching a pattern of trenches in the substrate, depositing one or more dielectric materials (such as silicon dioxide) to fill the trenches, and removing excess dielectric material using a subsequent etching technique such as, for example, chemical-mechanical planarization (CMP).

The etching processes performed during STI formation, however, can also inadvertently recess the bottom source/drain region and bottom spacers of vertically orientated NMOS and PMOS transistors located proximate to the edges of the STI element. Consequently, the dimensions of the NMOS and PMOS transistors located proximate to the edges vary (i.e., have a different profile) compared to the dimensions of the remaining NMOS and PMOS transistors. Therefore, conventional STI formation techniques currently applied to CMOS VFET devices undesirably increase the variability of the overall device. This process variation causes measurable and predictable variances in the output performance to mismatch, and can cause reduced performance from one device compared to another according to the same fabrication process.

Turning now to an overview of the aspects of the invention, one or more embodiments of the invention address the above-described shortcomings of the prior art by providing a VFET fabrication process that forms an STI element between a pair of VFETs without recessing the bottom source/drain region and the bottom spacer. In this manner, all the VFETs included in the fabricated semiconductor device have a uniform bottom source/drain region and spacer, thereby reducing device variability while also avoiding process variations to improve device yield.

Turning now to a more detailed description of aspects of the present invention, FIG. 1 illustrates an intermediate semiconductor device 100. In the present specification and claims, an "intermediate" semiconductor device is defined as a semiconductor device in a stage of fabrication prior to a final stage. The intermediate semiconductor device 100 includes a plurality of semiconductor fins 102 formed from a semiconductor substrate 104, and a bottom source/drain region 106 formed on an upper surface of the substrate 104.

The substrate 104 can be formed from any appropriate material including, e.g., a bulk semiconductor structure or a semiconductor-on-insulator (SOI) layered structure. Illustrative examples of suitable materials for the substrate 104 include, but are not limited to, silicon, silicon germanium, silicon germanium carbide, silicon carbide, polysilicon, an epitaxial semiconductor material (e.g., epitaxially grown silicon, silicon germanium, etc.), amorphous silicon, and multi-layers thereof. Although silicon is the predominantly used semiconductor material in wafer fabrication, alternative semiconductor materials can be employed, such as, but not limited to, germanium, gallium arsenide, gallium nitride, silicon germanium, cadmium telluride and zinc selenide.

The bottom source/drain region 106 is formed on the substrate 104 having an exemplary thickness of about 10 nm to about 100 nm. In one embodiment it is contemplated that the bottom source/drain region 106 is formed from a doped semiconductor material. It should be understood that the bottom source/drain region 106 can be either one of a source region or a drain region, as appropriate. Illustrative examples of suitable materials for the bottom source/drain region 106 include, but are not limited to, silicon, silicon germanium, silicon germanium carbide, silicon carbide, polysilicon, an epitaxial semiconductor material (e.g., epitaxially grown silicon, silicon germanium, etc.), amorphous silicon, and multi-layers thereof. Although silicon is the predominantly used semiconductor material in wafer fabrication, alternative semiconductor materials can be employed, such as, but not limited to, germanium, gallium arsenide, gallium nitride, silicon germanium, cadmium telluride and zinc selenide.

In another embodiment, the source/drain region 106 can be formed from a III-V semiconductor. The term "III-V compound semiconductor" denotes a semiconductor material that includes at least one element from Group III of the Periodic Table of Elements and at least one element from Group V of the Periodic Table of Elements. Typically, the III-V compound semiconductors are binary, ternary or quaternary alloys including III/V elements. Examples of III-V compound semiconductors that can be used in the present embodiments include, but are not limited to alloys of gallium arsenic, aluminum arsenic, indium gallium arsenic, indium aluminum arsenic, indium aluminum arsenic antimony, indium aluminum arsenic phosphorus, indium gallium arsenic phosphorus and combinations thereof.

The bottom source/drain region 106 can be doped with dopant atoms. The dopant atoms can be an n-type dopant (i.e., an element from Group IV or VI of the Periodic Table of Elements) or a p-type dopant (i.e., an element from Group II or VI of the Periodic Table of Elements). Exemplary n-type dopants for a group IV semiconductor include phosphorus, arsenic and antimony. Exemplary p-type dopants for a group IV semiconductor include boron, aluminum, and gallium. Exemplary n-type dopants for a III-V semiconductor include selenium, tellurium, silicon, and germanium. Exemplary p-type dopants for a III-V semiconductor include beryllium, zinc, cadmium, silicon, and germanium. The concentration of dopant within the doped region is typically range from approximately $1 \times 10^{19}$ cm$^{-3}$ to approximately $3 \times 10^{21}$ cm$^{-3}$, or more typically between about $2 \times 10^{20}$ cm$^{-3}$ to about $3 \times 10^{21}$ cm$^{-3}$. The bottom source/drain region 106 can be in situ doped as it is deposited on the substrate 1 or, alternatively, can be doped through any other suitable doping technique, including but not limited to, ion implantation, gas phase doping, plasma doping, plasma immersion ion implantation, cluster doping, infusion doping, liquid phase doping, solid phase doping, in-situ epitaxy growth, or any suitable combination of those techniques.

The vertical semiconductor fins 102 can have a width ranging, for example, from about 5 nanometers (nm) to about 20 nm, a height ranging, for example, from about 10 nm to about 100 nm, and a fin pitch (DO ranging, for example, from of about 20 nm to about 100 nm. Various masking and etching techniques understood by one of ordinary skill in the art can be used to form the vertical semiconductor fins, including but not limited to, lithography followed by etching, sidewall image transfer (SIT), self-aligned double patterning (SADP), self-aligned multiple patterning (SAMP), self-aligned quadruple patterning (SAQP). For example, a masking layer (not shown) can be deposited on the substrate 104, and then patterned to form one or more hardmasks 108 that define regions for forming the semiconductor fins 102. The substrate 104 can then be etched to remove material that is not covered by the hardmasks 108 to form the semiconductor fins 102.

The hardmasks 108 can be formed from soft and/or hard materials and can be formed using deposition, photolithography, and etching. In one or more embodiments, the hardmasks 108 can be formed from a silicon nitride (SiN) layer. In other embodiments, the hardmasks 108 can be formed from multiple layered materials such as silicon nitride/ silicon oxide.

In one or more embodiments, an anisotropic etch such as, for example, a reactive ion etch (RIE) process, is used to form the semiconductor fins. The RIE process is a form of plasma etching in which the surface to be etched is placed on a radio frequency powered electrode. During the etch, the surface to be etched takes on a potential that accelerates the etching species extracted from plasma toward the surface, where a chemical etching reaction takes place in the direction normal to the surface. Other examples of anisotropic etching that can be used at this point of the present invention include ion beam etching, plasma etching or laser ablation. In other embodiments, the semiconductor fins 102 can be formed by spacer imaging transfer technique well-known in the art.

Figure 2:
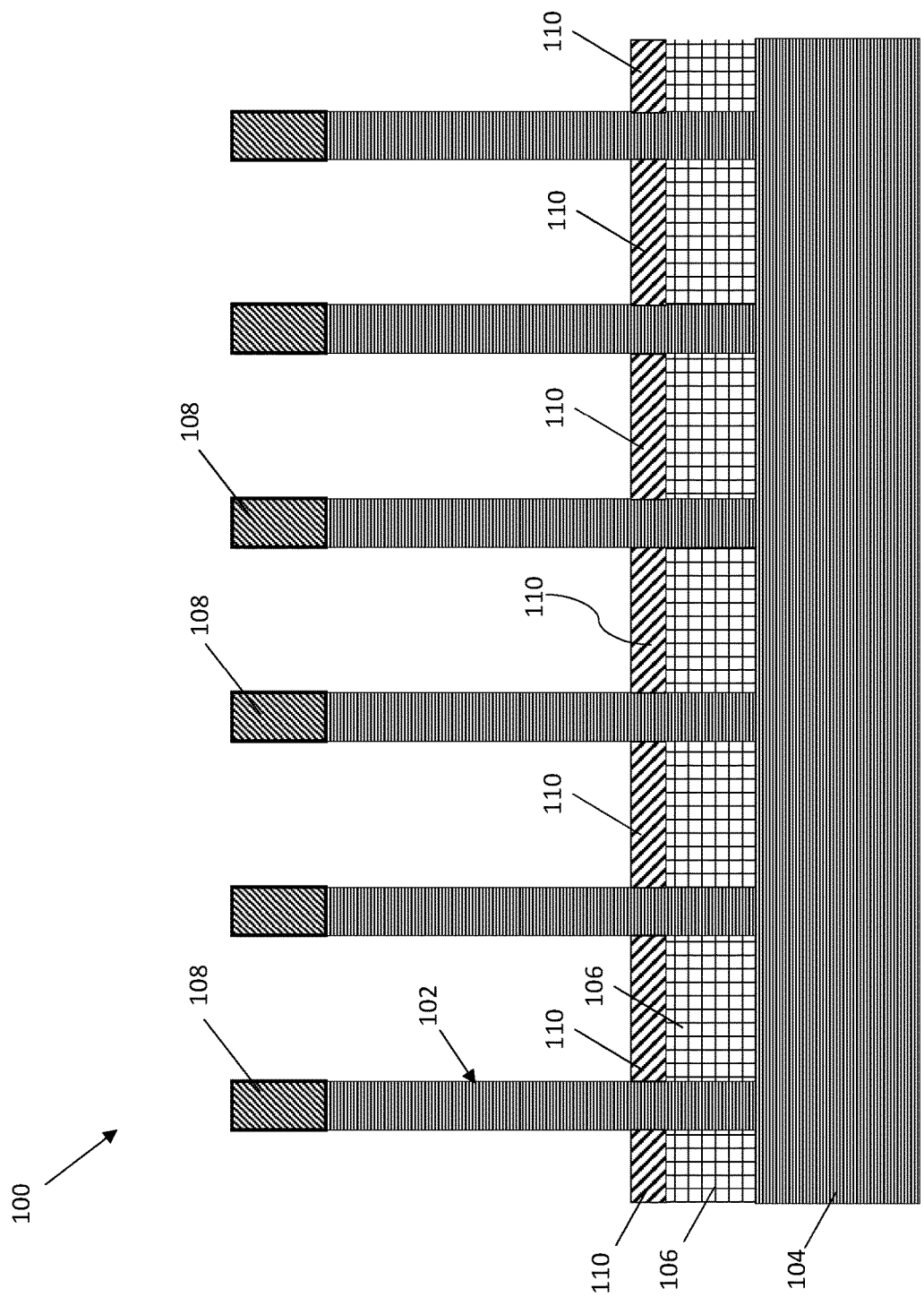
FIG. 2 depicts the semiconductor device following formation of a bottom spacer according to a non-limiting embodiment of the invention.

Turning to FIG. 2, a bottom spacer layer 110 is formed on the top surface of the bottom source/drain region 106. The bottom spacer layer 110 can be deposited in an anisotropic manner, without accumulation on the sidewalls of the semiconductor fins 102. This can be accomplished using, e.g., gas cluster ion beam (GCIB) deposition, where the surface of the bottom source/drain region 106 is bombarded by high-energy cluster ions. In other embodiments of the invention, other forms of deposition can be used to form the bottom spacer layer 110 only on horizontal surfaces, e.g., the bottom source/drain region 106. The bottom spacer layer 110 can be formed from any appropriate dielectric material such as, e.g., silicon dioxide, silicon nitride, silicon borocarbonitride, etc.

Figure 3:
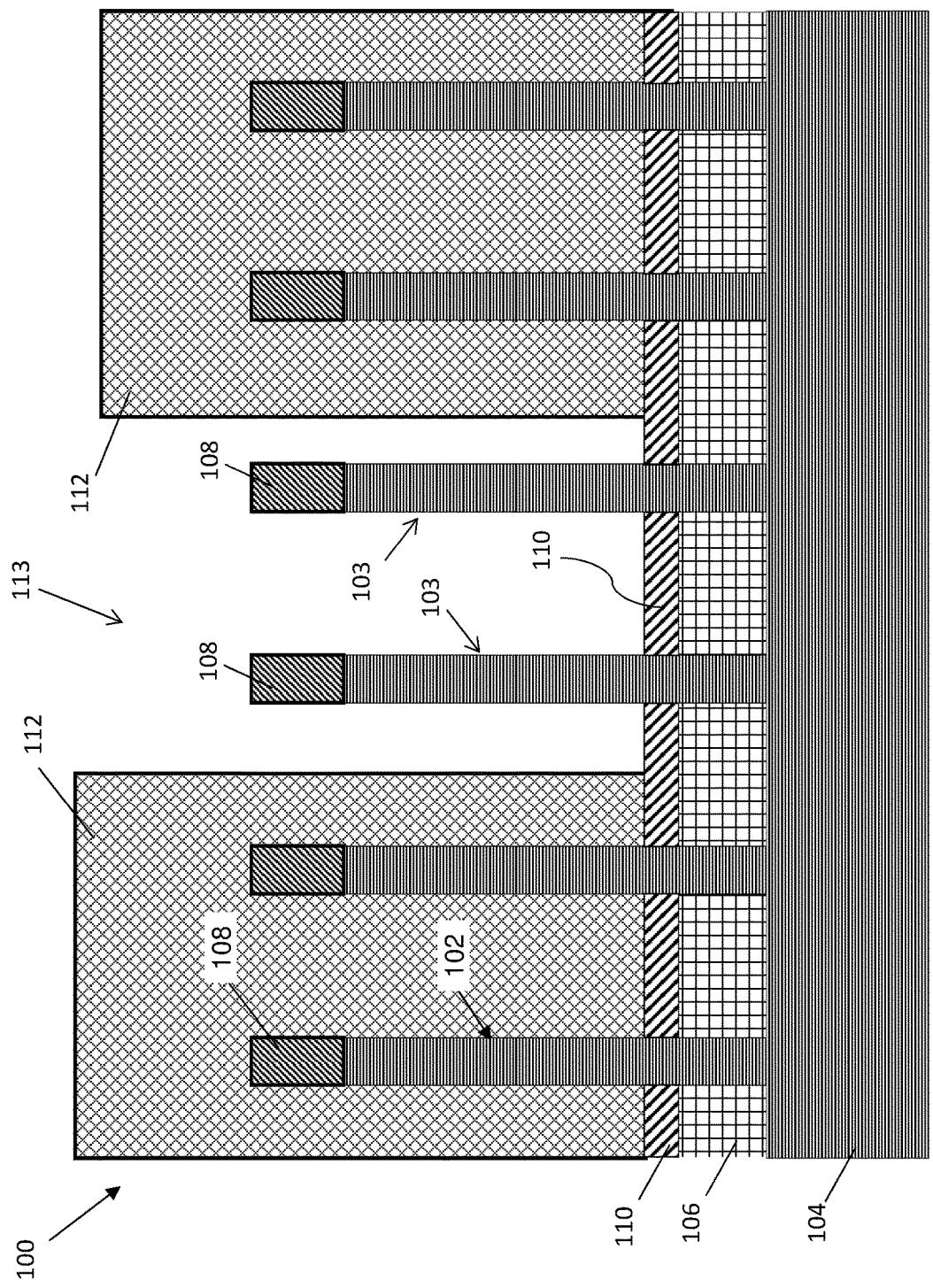
FIG. 3 depicts the semiconductor device after patterning a masking layer to expose sacrificial fins located at an isolation region according to a non-limiting embodiment of the invention.

Referring to FIG. 3, a mask 112 is deposited on an upper surface of the bottom spacer layer 110 to completely cover the semiconductor fins 102. The mask 112 can include a photoresist material that is deposited using various known deposition techniques such as, for example, spin coating. The mask 112 is then subsequently patterned using various photolithography processes (e.g., a resist developing technique) to form an opening 113 that exposes one or more sacrificial fins 103 as further illustrated in FIG. 3. In other embodiments, the mask 112 can include an optical planarization layer (OPL) patterned by lithography and etching processes. Although two sacrificial fins 103 are illustrated in FIG. 3, it should be appreciated that more sacrificial fins (e.g., 3, 5, 8, 9, etc.) or less sacrificial fins (e.g., 1 sacrificial fin) can be formed without departing from the scope of the invention.

Figure 4:
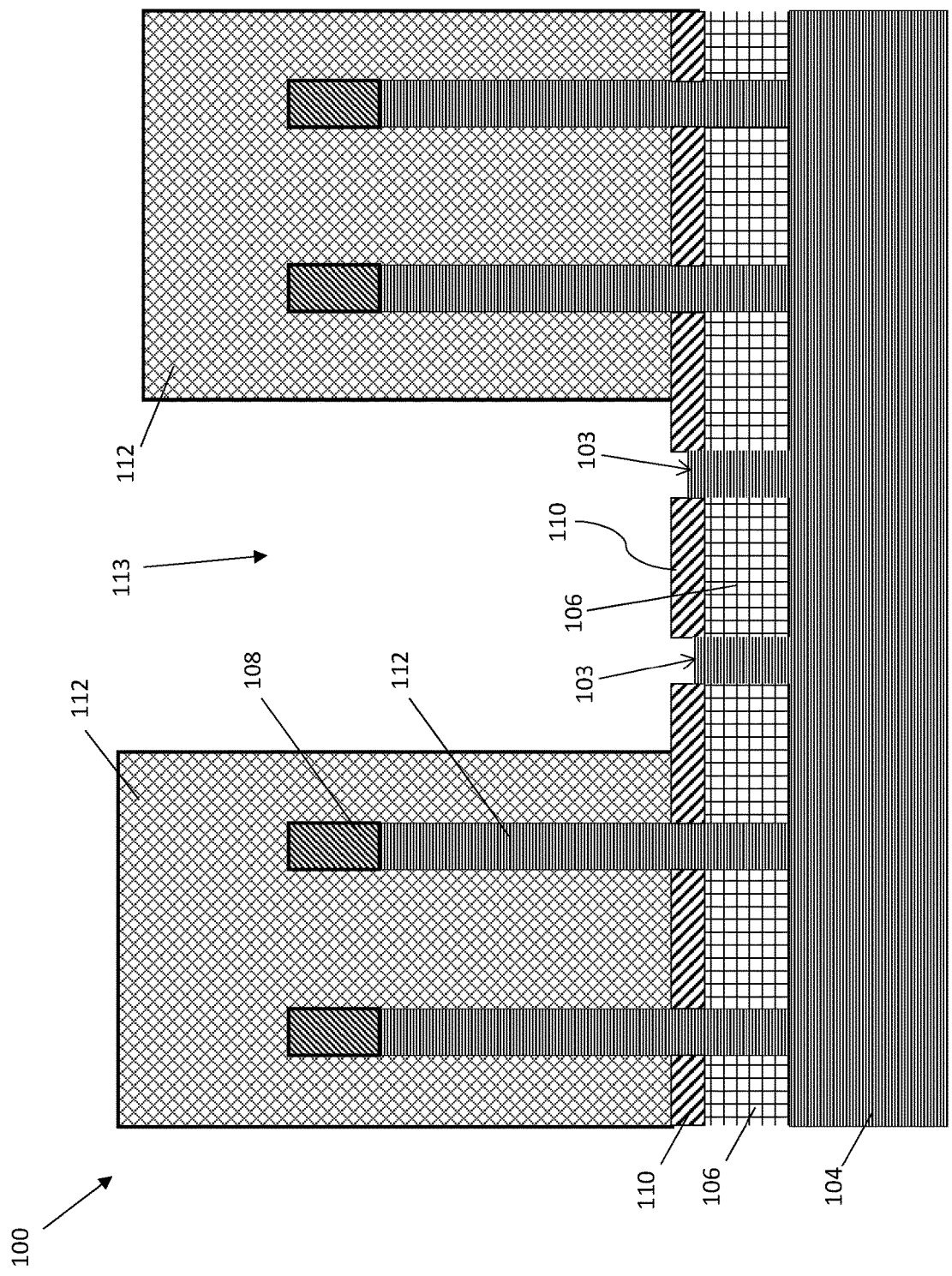
FIG. 4 depicts the semiconductor device after removing the sacrificial fins from the isolation region according to a non-limiting embodiment of the invention.

Turning to FIG. 4, the semiconductor device 100 is illustrated following one or more etching processes that removes the sacrificial fins 103 from the substrate 102. In one or more embodiments of the invention, a first etching process can be performed that first removes the hardmasks 108 from the sacrificial fins 103. A second etching process is then used to recess the sacrificial fins 103. The second etching process can include, for example, an isotropic etching process that is selective to the material (e.g., Si) of the sacrificial fins 103. Accordingly, the sacrificial fins 103 can be recessed while preserving the etching the mask 112, the bottom spacer layer 110, and the bottom source/drain region 106.

Figure 5:
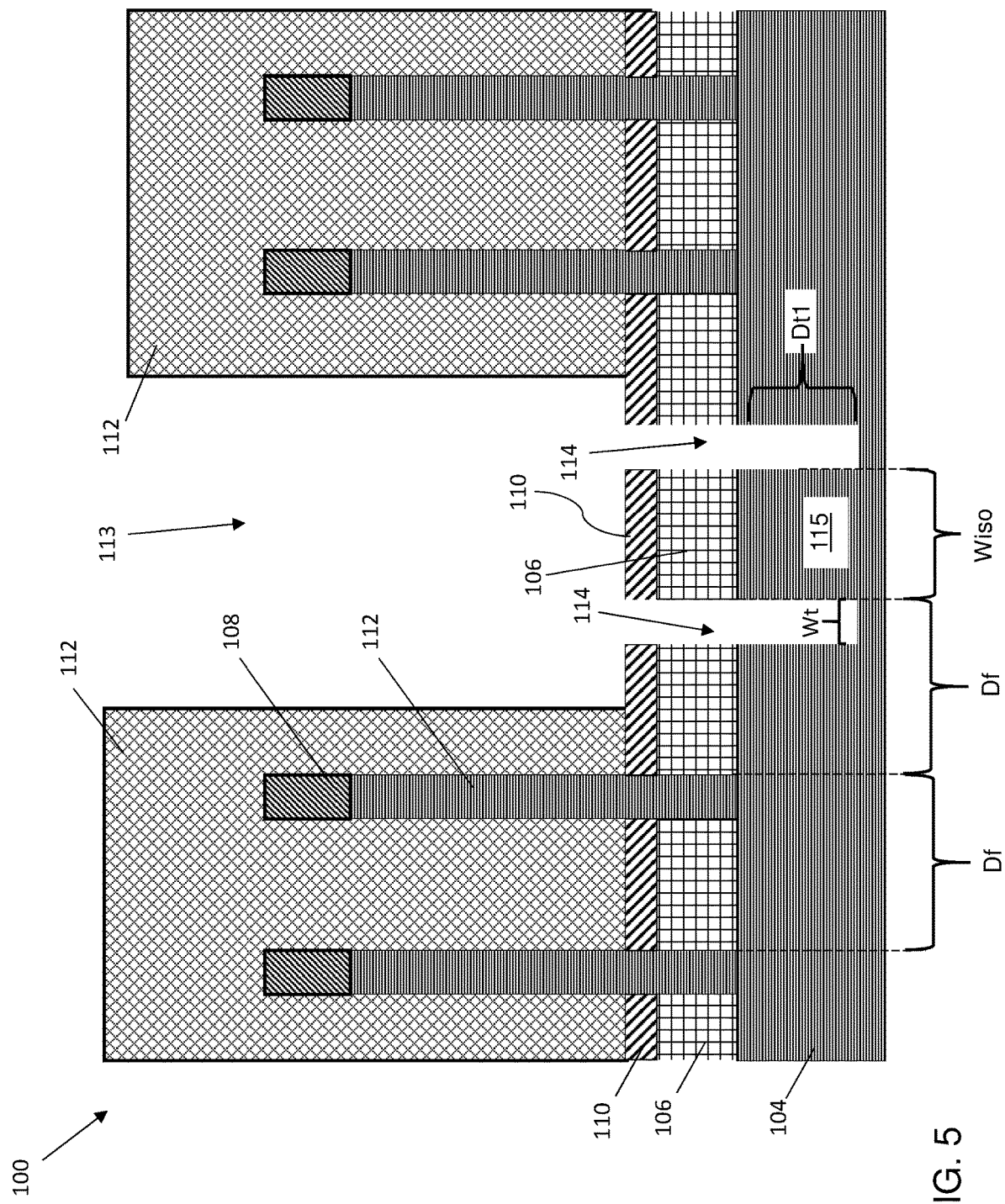
FIG. 5 depicts the semiconductor device after forming trenches in the substrate according to a non-limiting embodiment of the invention.

Turning to FIG. 5, trenches 114 can be formed in the substrate 102 using a separate etching process that recesses a remaining portion of the sacrificial fins 103 following the fin etching process described above. For example, a directional RIE process can be used to remove the remaining portions of the sacrificial fins 103, while using the bottom spacer 110 as a mask. Accordingly, a separate mask is not required to form the trenches 114, which extend through the bottom spacer layer 110 and the bottom source/drain region 106, and into the substrate 102. Forming the trenches using the subsequent RIE process described above achieves improved control over the width (Wt) of the trenches 114 to achieve a targeted narrow width.

In one or more embodiments of the invention, the distance (Dt1) at which the trenches 114 extends into the substrate 102 ranges from about 50 nanometers (nm) to about 200 nm. The width (Wt) of the trenches 114 can range, for example, from about 5 nm to about 20 nm, and have a trench pitch (Dt2) that matches the fin pitch (Df). As illustrated in FIG. 5, the width of the trenches (Wt) is less than the pitch (DO between a pair of neighboring trenches 114. Although a two-step etching process is described to recess the sacrificial fins 103 and form the trenches 114, it should be appreciated that a single RIE process, for example, can be used to recess the sacrificial fins 103 and form the trenches 114. However, the ability to control the width of the trenches 114 using a single RIE process is slightly reduced.

Still referring to FIG. 5, the region located between a pair of trenches 114 is referred to herein as an isolation region 115. The isolation region 115 includes remaining portions of the substrate 102, the bottom source/drain region 106 and the bottom spacer 110, and can have a width (Wiso) ranging from about 15 nm to about 50 nm. This isolation region 115 will be subsequently filled with a dielectric material to form an STI structure (not shown in FIG. 5). The trenches 114 will be filled with a dielectric material to form trench spacers (not shown in FIG. 5), which work in conjunction with the STI structure to prevent edge fin variation of a completed VFET transistor described in greater detail below.

Figure 6:
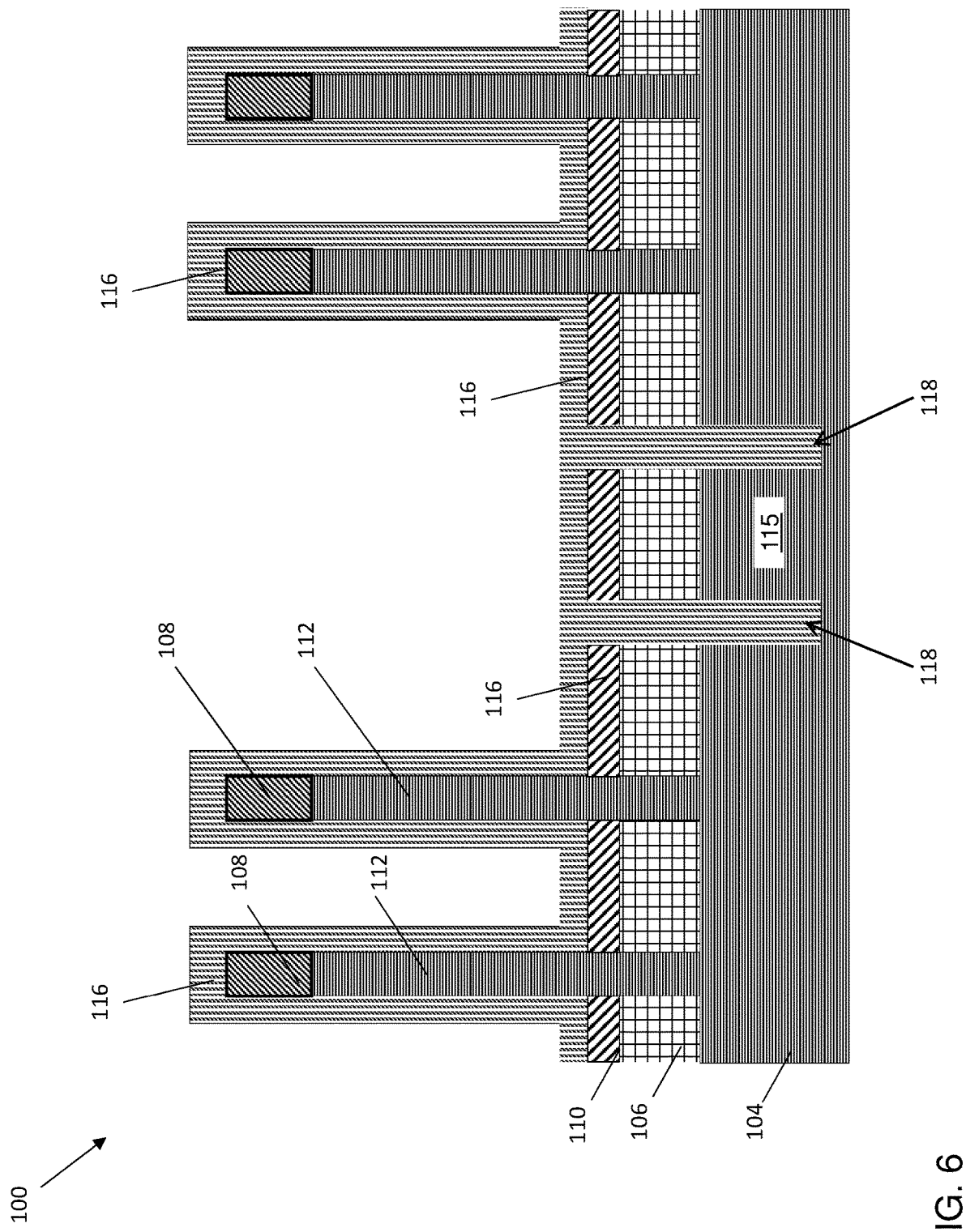
FIG. 6 depicts the semiconductor device following deposition of a conformal dielectric material according to a non-limiting embodiment of the invention.

Referring now to FIG. 6, the semiconductor device 100 is illustrated after stripping away the mask 112, and subsequently filling the trenches 114 with a dielectric material 116. The dielectric material 116 can include a dielectric material such as silicon oxynitride (SiON), for example, and can be deposited using various deposition techniques including, but not limited to, atomic layer deposition (ALD), plasma deposition, e.g., plasma enhanced vapor chemical deposition (PECVD).

The mask 112 can be removed using a various etchants or etching techniques. For example, the mask 112 can be removed using a wet etching process or plasma etch process when it is formed from a photoresist material. When the mask 112 is formed from an OPL material, the mask 112 can be removed by oxygen plasma etching process, ozone ashing process, or a wet etch process containing sulfuric acid and hydrogen peroxide.

In one or more embodiments of the invention, the dielectric material 116 is conformally deposited after stripping away the mask 112 so that the dielectric material lines the outer surfaces of the bottom spacer layer 110 and active fins 102, while completely filling the trenches 114. In one or more embodiments of the invention, the thickness of the dielectric material 116 deposited in the trench 114 can be equal to or greater than half the width of the trench 114. For example, if the width of the trenches 114 are 10 nm, the thickness of the dielectric material 116 deposited in the trenches 114 can be 5 nm. Accordingly, the dielectric material 116 deposited in the trenches 114 will "pinch off" thereby completely filling the trenches 114.

Figure 7:
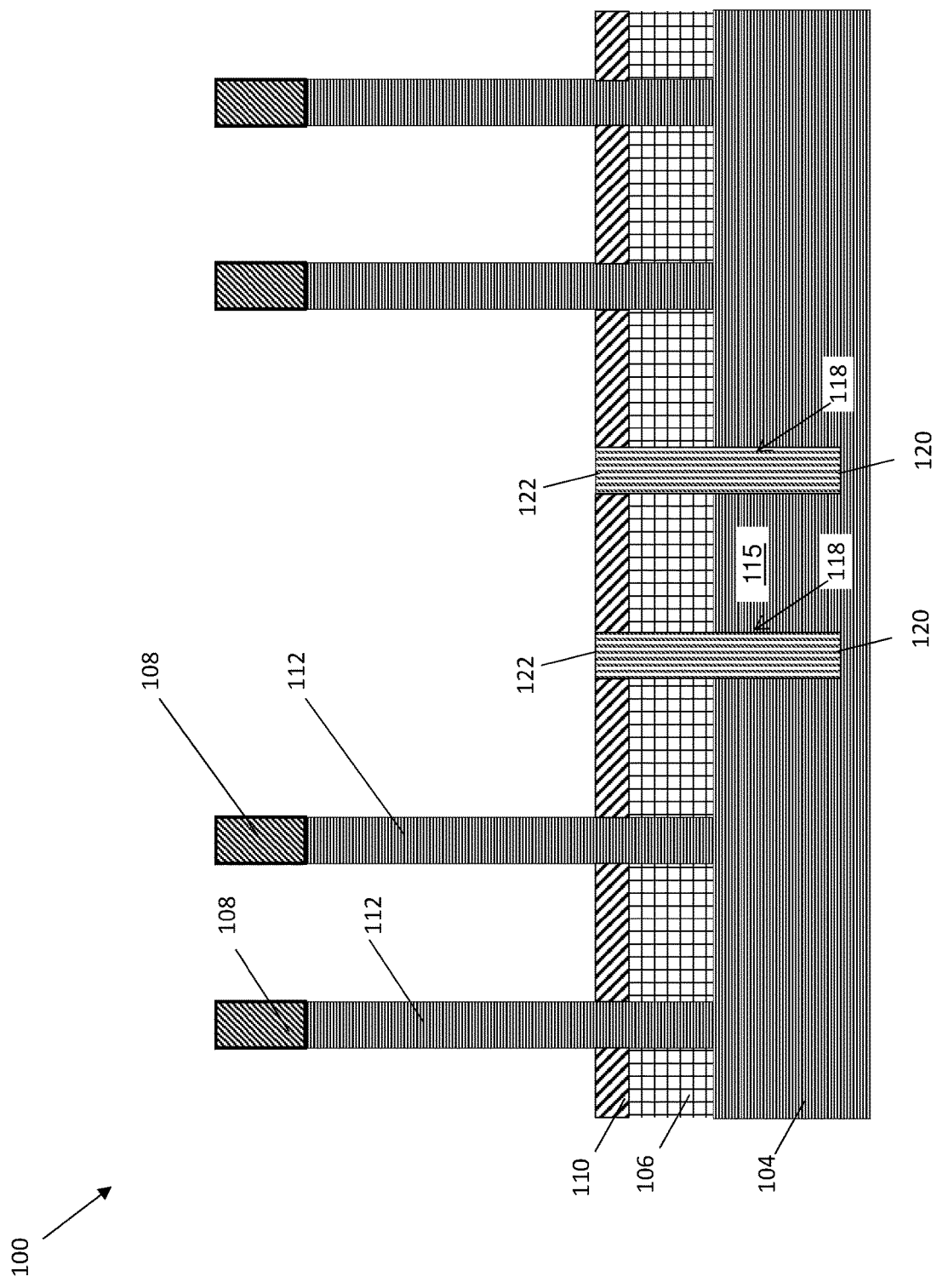
FIG. 7 depicts the semiconductor device after removing portions of the dielectric material to form trench spacers according to a non-limiting embodiment of the invention.

Turning to FIG. 7, the semiconductor device 100 is illustrated after removing excess portions of the dielectric material 116 from the outer surfaces of the bottom spacer layer 110 and active fins 102, while maintaining the dielectric material in the trench 114. When the dielectric material 116 comprises SiON, for example, an isotropic etch process such as a wet etching process containing hydrofluoric acid (HF) can be used to remove the dielectric material 116. The etch amount is designed such that it etches slightly more than the thickness of the deposited dielectric material 116. In this manner, the dielectric material 116 from the outer surfaces of the bottom spacer layer 110 and active fins 102 is removed, while maintaining the dielectric material in the trench 114. Because the etch process is isotropic and the trenches 114 are completely filled by the dielectric material 116 (pinch-off), a desired amount of the dielectric material remains in trenches 114 For example, the trench width can be 6 nm, such that 3 nm of the dielectric material 116 can be deposited to pinch off the trenches. In this manner, a small amount (e.g., about 1 nm of the dielectric material 116) may be recessed from top of the trenches. Accordingly, dielectric trench spacers 118 are formed in the trenches 114. In one or more embodiments, the trench spacers 118 have a lower end 120 that directly contacts the substrate 102 (i.e., a base of the trench formed in the substrate 102) and an upper end 122 that is flush (i.e., co-planar) with an upper surface of the bottom spacer layer 110. The sidewalls of the trench spacers 118 therefore have sidewalls that directly contact the substrate 102, the bottom source/drain region 106, and the bottom spacer 110.

Figure 8:
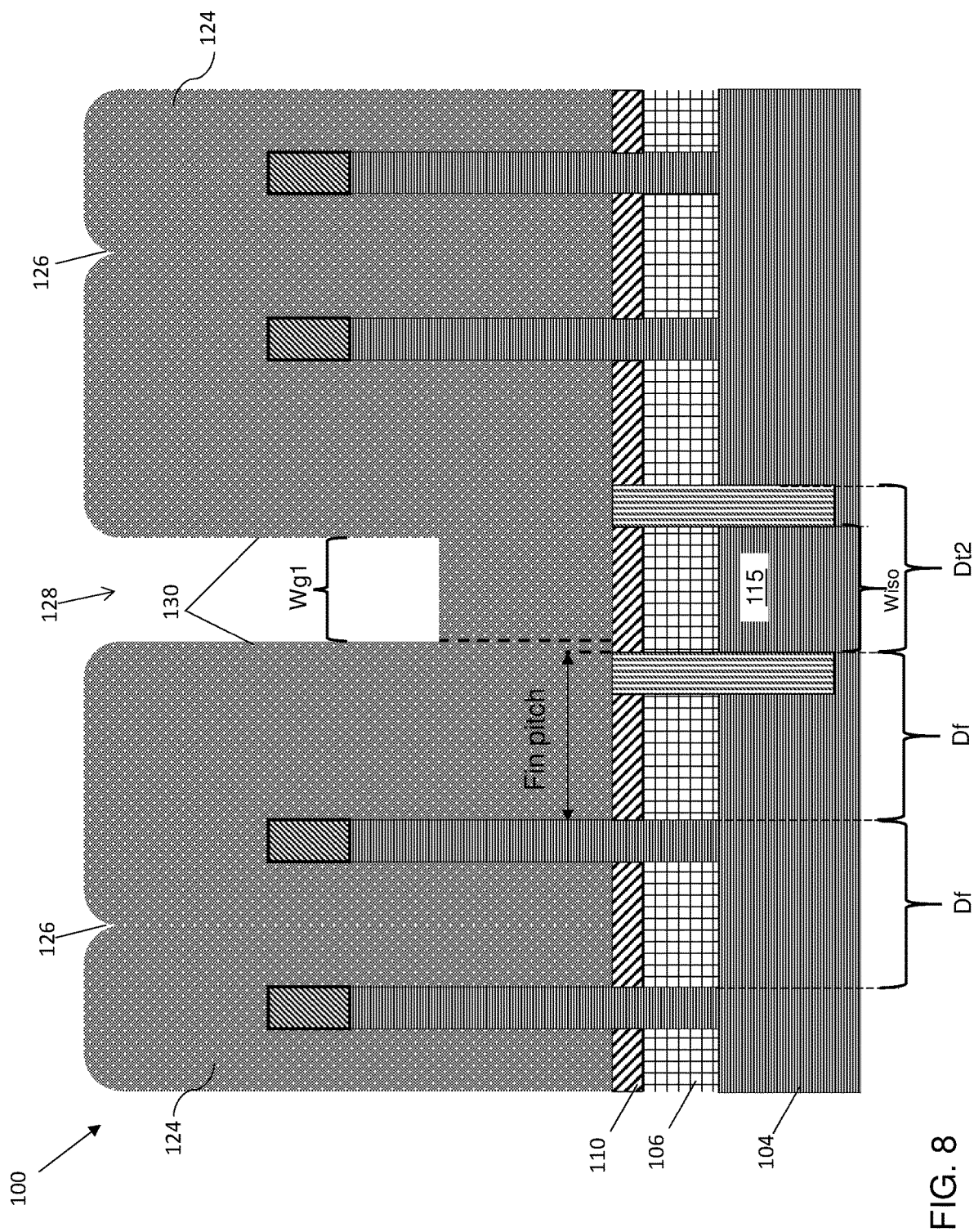
FIG. 8 depicts the semiconductor device following deposition of a sacrificial spacer material according to a non-limiting embodiment of the invention.

Turning to FIG. 8, the semiconductor device 100 is illustrated following deposition of a sacrificial spacer material 124. The sacrificial spacer material 124 is deposited on the upper surface of the bottom spacer layer 110 and completely covers the semiconductor fins 102. The sacrificial spacer material 124 can include a dielectric material such as, for example, amorphous carbon.

In one or more embodiments of the invention, the sacrificial spacer material 124 can be conformally deposited using a PECVD process. The deposition thickness is equal to or greater than fin pitch but less than half of wide spacing between the fins (for example, the second and the third fins in FIG. 8) where other fins are already removed. As a result, closely pinched-off regions 126 are formed at portions of the sacrificial spacer material 124 located between pairs of close neighboring active fins 102, while a gap 128 is formed above the isolation region 115 due to the larger distance between adjacent fins 102. The gap 128 can have a gap width (Wg1) ranging, for example, from approximately 10 nm to approximately 80 nm.

Still referring to FIG. 8, the sacrificial spacer material 124 can be deposited so that the gap sidewalls 130 extend beyond the trench spacers 118 and are overlapped with respect to the isolation region 115. In other words, the gap width (Wg1) is less than the width (Wiso) of the isolation region 115.

Figure 9:
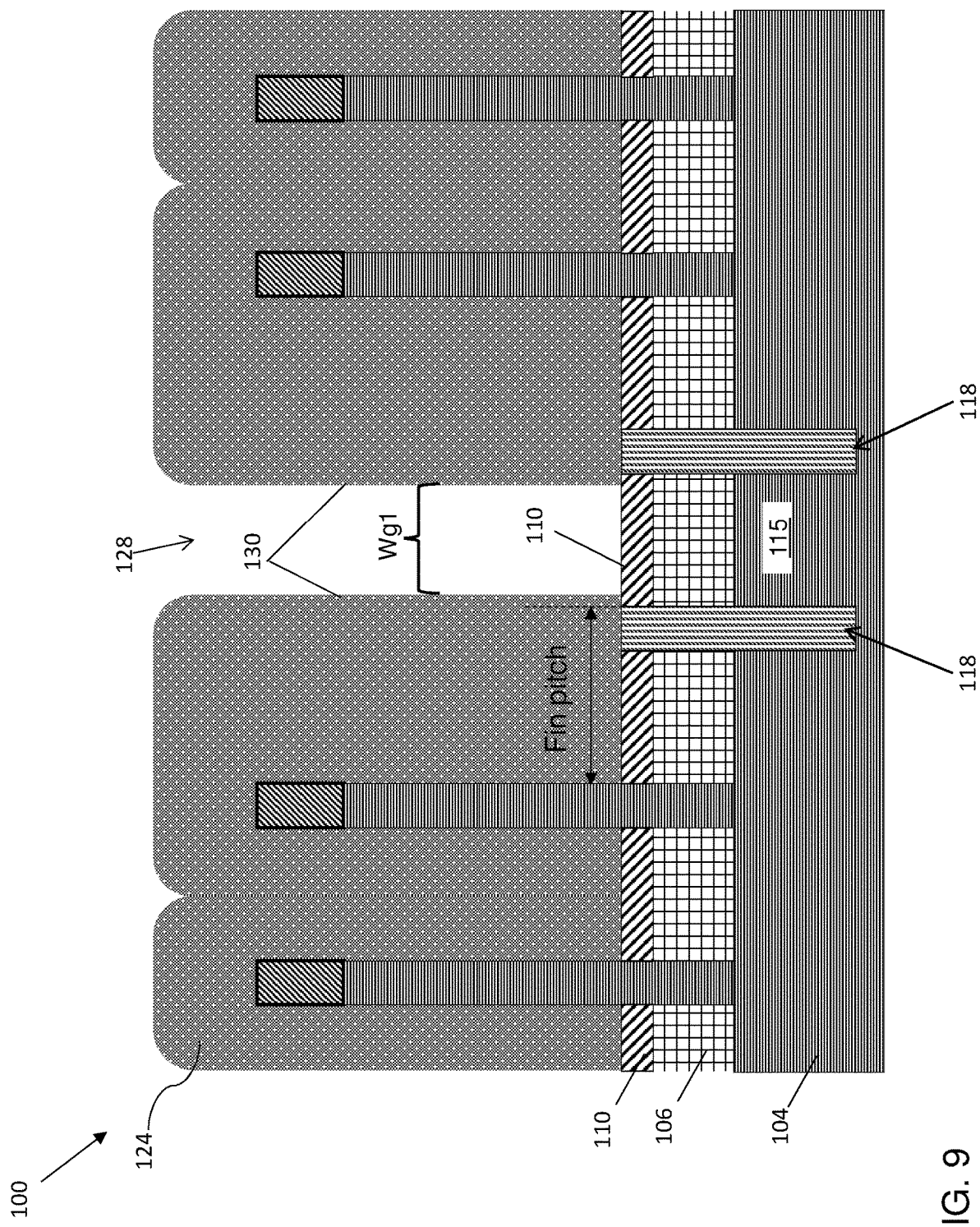
FIG. 9 depicts the semiconductor device following an etching process that forms a gap to expose the bottom spacer at the isolation region according to a non-limiting embodiment of the invention.

With reference now to FIG. 9, the semiconductor device 100 is illustrated after extending the gap 128 into the sacrificial spacer material 124. Accordingly, a portion of the bottom spacer 110 located at the isolation region 115 is exposed. Various known directional etching processes can be used to extend the gap 128.

Figure 10:
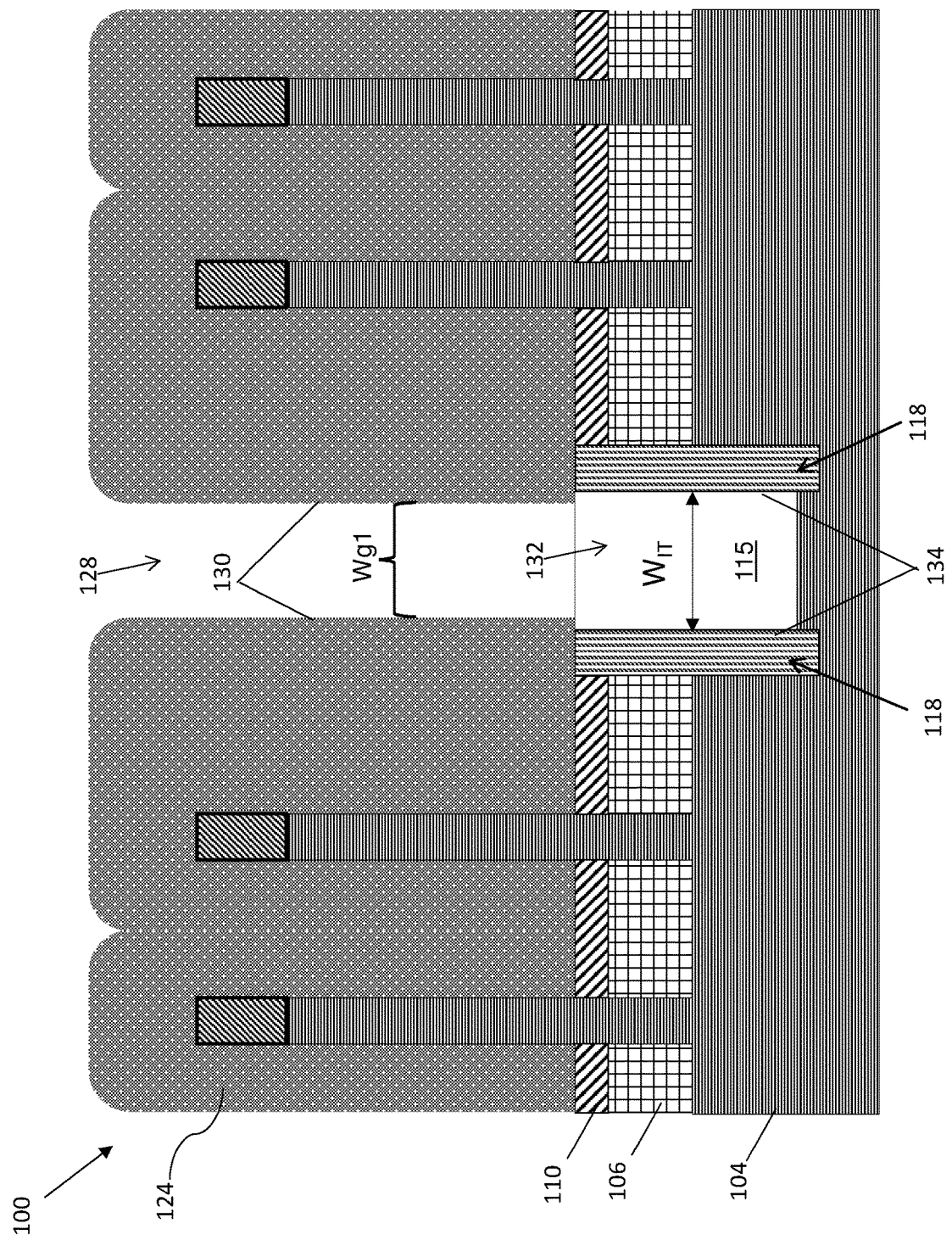
FIG. 10 depicts the semiconductor device following an etching process that forms an isolation trench in the isolation region according to a non-limiting embodiment of the invention.

Turning to FIG. 10, the semiconductor device 100 is illustrated after etching into the isolation region 115 to form an isolation trench 132. The sacrificial spacer material 124 can be used as a mask while one or more etching process are performed to form the isolation trench 132. For example, a first etching process can be used to remove the exposed portion of the bottom spacer 110, while a second etching process is used to remove a portion of the bottom source/drain region 106 and a portion of the substrate 102 located in the isolation region 115. In other embodiments a first vertical etching process can be performed to remove the exposed bottom spacer 110, bottom source/drain region 106 and substrate 102, while a second etching processed is performed to laterally etch remaining portions of the bottom spacer, 110, bottom source/drain region 106 and substrate 102 located in the isolation region 115, while stopping on the sidewalls 134 of the trench spacers 118. A dry etch process having a sulfur hexafluoride (SF6) chemistry, for example, can be used to perform the lateral etch. Other suitable etch processing includes but is not limited to, ammonia etch, hydrogen chloride (HCl) gas etch. In one or more embodiments of the invention, the isolation trench 132 has a width ($W_{IT}$) that is greater than the width (Wg1) of the gap 128.

Figure 11:
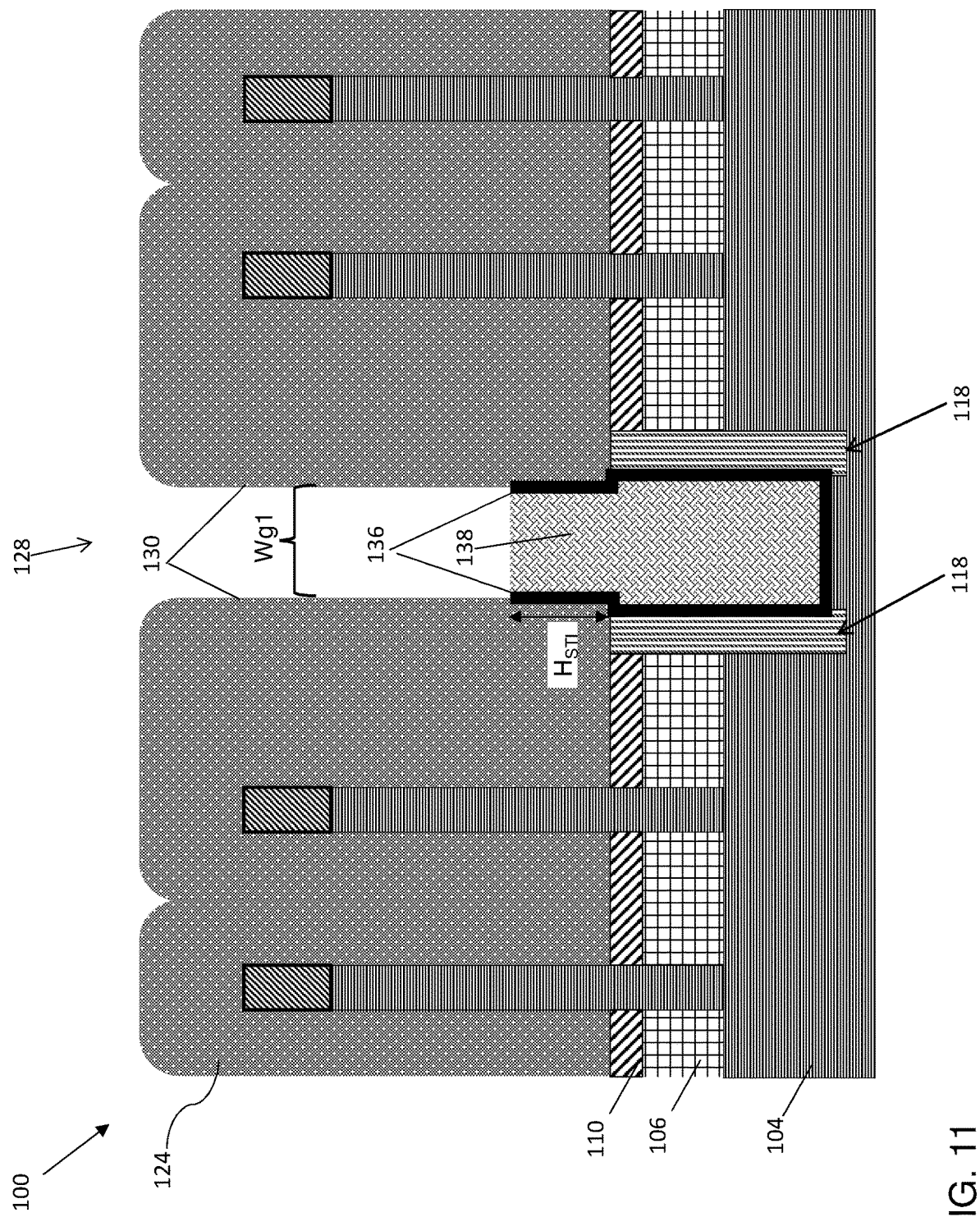
FIG. 11 depicts the semiconductor device after filling the isolation trench with a shallow trench isolation material according to a non-limiting embodiment of the invention.

In FIG. 11, the semiconductor device 100 is illustrated after depositing a trench liner 136 and trench dielectric material 138 in the isolation trench 132 and the gap 128. The trench liner 136 can include a nitride material such as SiN, for example, and can have a thickness ranging, for example, from about 2 nm to about 5 nm. The trench liner 136 can be deposited using a conformal deposition process such as, for example, atomic layer deposition (ALD), chemical vapor deposition (CVD) so that the trench liner 136 conforms to the sidewalls 130 of the gap 128, along with the sidewalls 134 of the isolation trench 132. In some embodiments, the trench liner 136 is omitted. The trench dielectric material 138 can include a dielectric materials, for example, a flowable oxide material such as silicon oxide. Various deposition processes can be used to deposit the trench dielectric material 138. CVD and/or spin-on.

Still referring to FIG. 11, an etching process can be performed to partially recess the trench liner 136 and trench dielectric material 138 located in the gap 128. In one or more embodiments of the invention, the trench liner 136 and trench dielectric material 138 are etched so that the upper portions of the trench liner 136 and trench dielectric material 138 remain above the bottom spacer 110 and trench spacers 118. The trench dielectric material 138 can be etched by dry etch (e.g., plasma etch, reactive ion etch, chemical dry etch), wet etch (e.g., hydrofluoric acid (HF), buffered hydrofluoric acid (BHF), diluted hydrofluoric acid (DHF), or any suitable combination of those etch processes. The trench liner 136, if present, can be etched by an isotropic etch process such as wet etch or chemical dry etch. Accordingly, the upper portions of the trench liner 136 and trench dielectric material 138 can have a height ($H_{STI}$) ranging from about 0 nm to about 30 nm.

Figure 12:
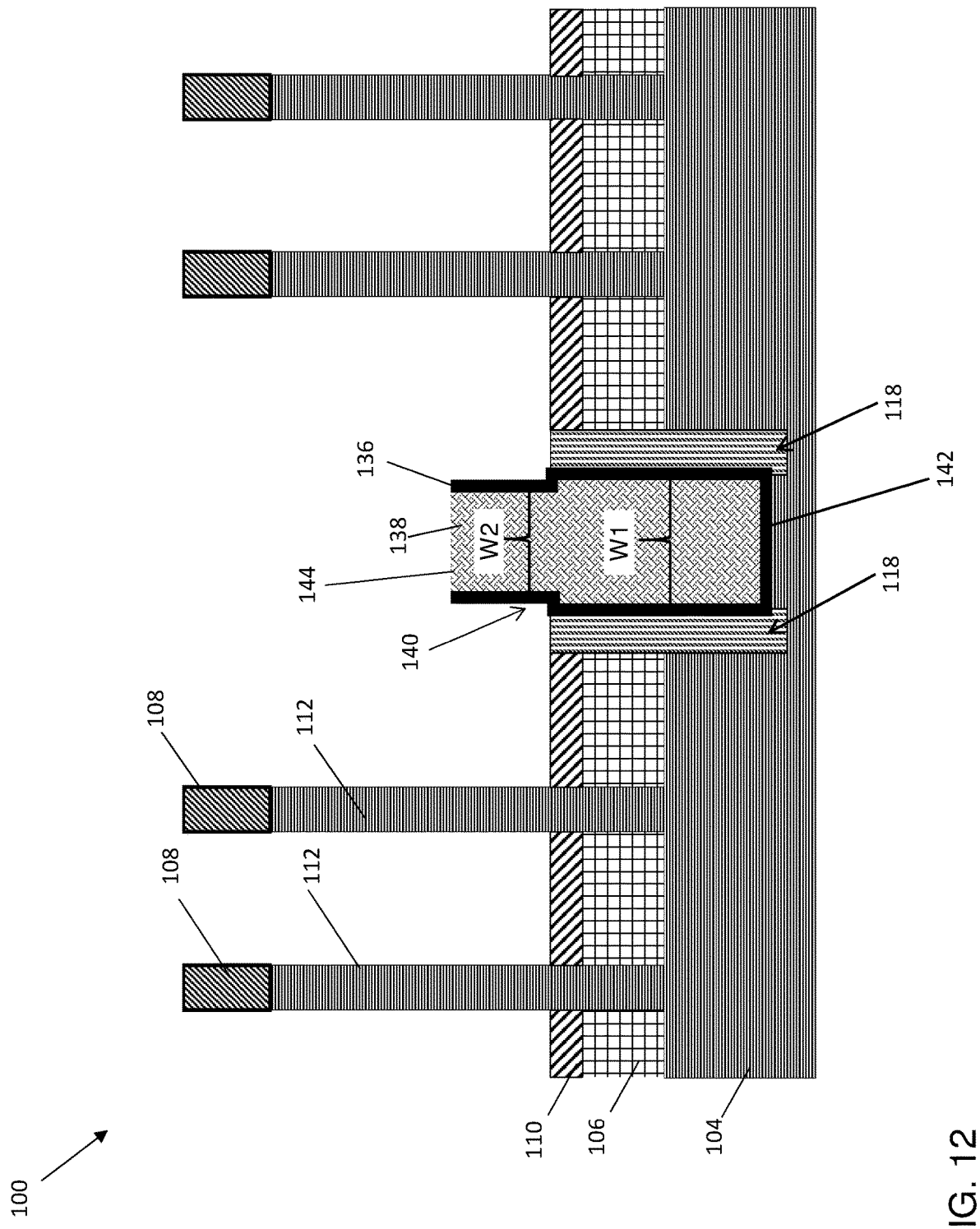
FIG. 12 depicts the semiconductor device after removing the sacrificial spacer material to form a shallow trench isolation element having a bottleneck profile according to a non-limiting embodiment of the invention.

With reference now to FIG. 12, the semiconductor device 100 is illustrated following removal of the sacrificial spacer material 124. The sacrificial spacer material 124 can be removed using, for example, an oxygen-based plasma etching process. Accordingly, a shallow trench isolation (STI) element 140 is formed in the isolation region 115 and between the trench spacers 118. The STI element 140 has a lower portion 142 and an upper portion 144. The lower portion 142 has a first width (W1) and is formed such that the trench liner 136 is directly against the substrate 102 and the sidewalls of the trench spacers 118. The upper portion 144 has a second width (W2), which is less than the first width (W1) such that the STI element 140 has a bottleneck cross-sectional profile.

Figure 13:
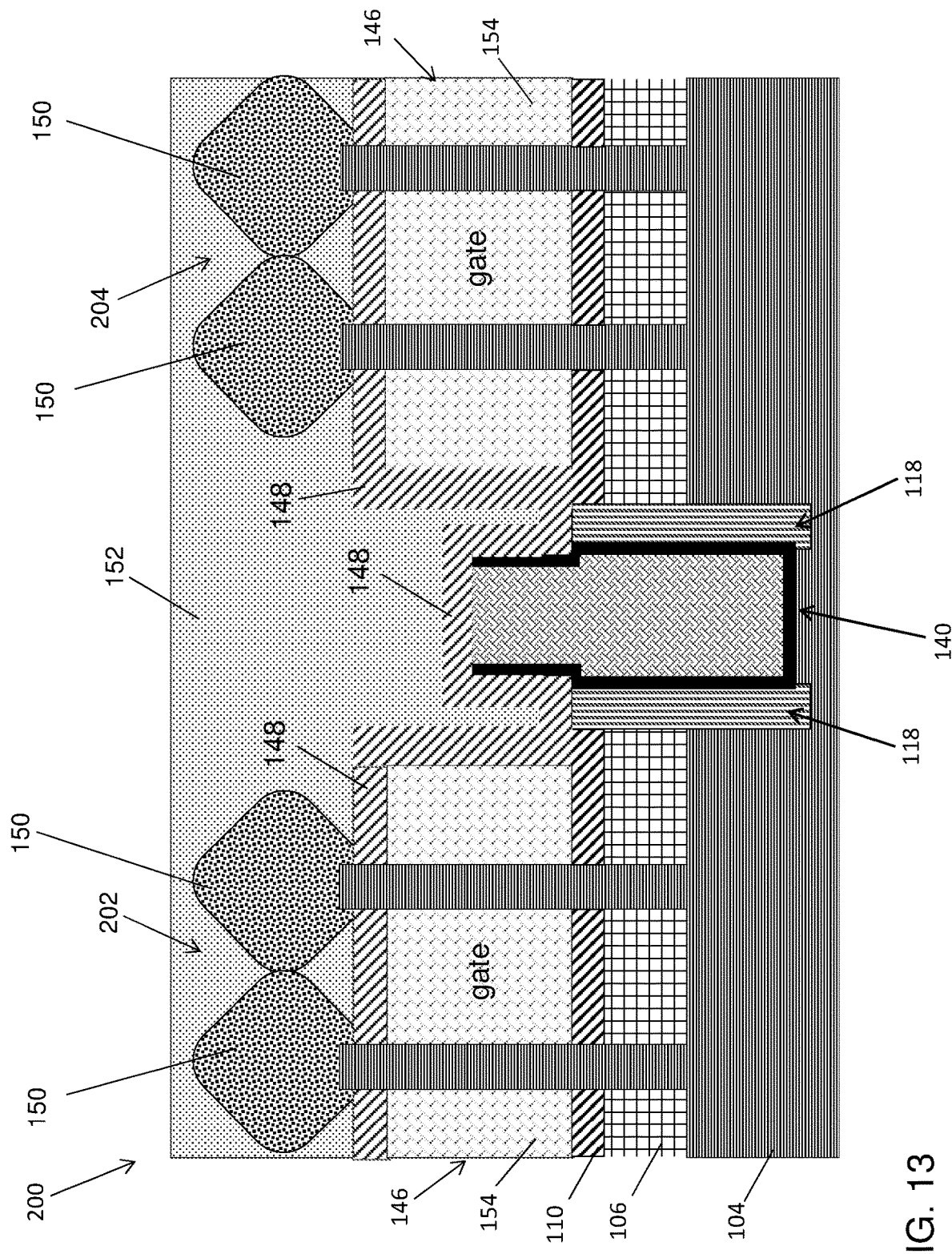
FIG. 13 depicts a completed semiconductor device including the shallow trench isolation (STI) element having been formed without recessing the bottom source/drain region and the bottom spacer according to a non-limiting embodiment of the invention.

Turning to FIG. 13, a completed VFET semiconductor device 200 is illustrated which includes the STI element 140. The completed VFET semiconductor device 200 can include first and second VFET transistors 202 and 204, which are electrically isolated from one another via the STI element 140. The fabrication operations described above achieves formation of the STI element 140 between a pair of VFETs 202 without recessing the bottom source/drain region 106 and the bottom spacer 110. In this manner, all the VFETs included in the completed VFET semiconductor device 200 have a uniform bottom source/drain region 106 and bottom spacer 110.

The completed VFET semiconductor device 200 includes one or more gate structures 146, a top spacer 148, top source/drains 150, and an inter-level dielectric (ILD) 152. The gate structures 146 can be formed by depositing a gate material 154 on the upper surface of the bottom spacer 110 so that it covers the tops of the hardmasks 108 The gate material 154 can include a gate conductive material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. Ti3Al, ZrAl), TaC, TaMgC, carbon nanotube, conductive carbon, graphene, or any suitable combination of these materials. The conductive material may further comprise dopants that are incorporated during or after deposition. In some embodiments, the gate structure may further comprise a workfunction setting layer between the gate dielectric and gate conductor. The workfunction setting layer can be a workfunction metal (WFM). WFM can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and WFM. The gate conductor and WFM can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

Although not illustrated, the gate structures 146 can be fabricated as a high-k metal gate (HKMG), which includes one or more high-k dielectric films (not shown), and one or more work function metal (WFM) layers (not shown). The high-k dielectric films can be a dielectric material having a dielectric constant greater than, for example, 3.9, 7.0, or 10.0. Non-limiting examples of suitable materials for the high-k dielectric films include oxides, nitrides, oxynitrides, silicates (e.g., metal silicates), aluminates, titanates, nitrides, or any combination thereof. Examples of high-k materials with a dielectric constant greater than 7.0 include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric films can further include dopants such as, for example, lanthanum and aluminum. The high-k dielectric films can be formed by suitable deposition processes, for example, CVD, PECVD, atomic layer deposition (ALD), evaporation, physical vapor deposition (PVD), chemical solution deposition, or other like processes. The thickness of the high-k dielectric films can vary depending on the deposition process as well as the composition and number of high-k dielectric materials used. The high-k dielectric films can have a thickness in a range from about 0.5 to about 20 nm.

The WFM layers can be deposited over the high-k dielectric films. The type of work function metal used to form the WFM layers depends on the type of transistor and can differ between the nFET and pFET devices. P-type work function metals include compositions such as ruthenium, palladium, platinum, cobalt, nickel, and conductive metal oxides, or any combination thereof. N-type work function metals include compositions such as hafnium, zirconium, titanium, tantalum, aluminum, metal carbides (e.g., hafnium carbide, zirconium carbide, titanium carbide, and aluminum carbide), aluminides, or any combination thereof. The WFM can be deposited by a suitable deposition process, for example, CVD, PECVD, PVD, plating, thermal or e-beam evaporation, and sputtering.

The top spacer 148 is formed by depositing a spacer material on the gate structure 146. The hardmask 108 can be removed before or after the formation of the top spacer 148, using known etching processes, such as, for example, a wet etch, a dry etch, or a combination thereof. In some embodiments of the present invention, the gate structure 146 can be recessed below a surface of the fins 102 before depositing the top spacer 148. The gate structure 146 can be recessed using any suitable process, such as, for example, a wet etch, a dry etch, or a combination thereof, which is selective to the materials of the gate structure 146. Accordingly, the gate structure 146 can be recessed while preserving the fins 102.

The top spacer 148 can include a dielectric material, such as, for example, SiN, SiC, SiOC, SiCN, BN, SiBN, SiBCN, SiOCN, $SiO_xN_y$, and combinations thereof. The dielectric material can be a low-k material having a dielectric constant less than about 7, less than about 5, or even less than about 3.9. The top spacer 148 can be formed using known deposition processes, such as, for example, CVD, PECVD, ALD, PVD, chemical solution deposition, or other like processes. In some embodiments of the present invention, the top spacer 148 is formed by performing a deposition process such as CVD.

The top source/drains 150 can be formed by selective epitaxial growth over exposed surfaces of the fins 102. The source/drain regions 150 can include epitaxial semiconductor materials grown from gaseous or liquid precursors. For example, epitaxial semiconductor materials can be grown using vapor-phase epitaxy (VPE), molecular-beam epitaxy (MBE), liquid-phase epitaxy (LPE), or other suitable processes.

In some embodiments of the present invention, the gas source for the deposition of epitaxial semiconductor material includes a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used.

Epitaxial silicon, silicon germanium, and/or carbon doped silicon (Si:C) can be doped during deposition (in-situ doped) or doped following the epitaxy by adding n-type dopants (e.g., As, P, Sb) or p-type dopants (e.g., Ga, B, In, BF2, Al), depending on the type of transistor (i.e., n-type dopants for an nFET and p-type dopants for a pFET). The dopant concentration in the source/drain regions 150 can range from $1 \times 10^{19}$ cm$-3$ to $2 \times 10^{21}$ cm$^{-3}$, or between $1 \times 10^{20}$ cm$^{-3}$ and $1 \times 10^{21}$ cm$^{-3}$.

In some embodiments of the invention, a top source/drain liner (not shown) can be formed on the top spacer 148 and top source/drain regions 150. The top source/drain liner can include a dielectric material, such as, for example, SiN, SiC, SiOC, SiCN, BN, SiBN, SiBCN, SiOCN, $SiO_xN_y$, and combinations thereof. The top source/drain liner can be formed using known deposition processes, such as, for example, CVD, PECVD, ALD, PVD, chemical solution deposition, or other like processes.

The ILD 152 can include a material selected from the group consisting of silicon-containing materials such as silicon oxide, silicon nitride, SiOxNy, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, α-C:H). Additional choices for the ILD 152 include: any of the aforementioned materials in porous form, or in a form that changes during processing to or from being porous and/or permeable to being non-porous and/or non-permeable. The blanket layer of the ILD 152 can be formed by deposition processes, including, but not limited to spinning from solution, spraying from solution, chemical vapor deposition (CVD), plasma enhanced CVD (PECVD), sputter deposition, reactive sputter deposition, ion-beam deposition, and evaporation.

Following the blanket deposition process, the ILD 152 can be recessed and planarized. Planarization is a material removal process that employs at least mechanical forces, such as frictional media, to produce a planar surface. One example of planarization is a chemical mechanical planarization (CMP) process, which uses both chemical reactions and mechanical forces to remove material and planarize a surface. Although not illustrated, electrically conductive vias can be formed in the ILD 152. The vias extend through the ILD 152 and directly contact the top source/drains 150 to provide electrical access thereto. One or more electrically conductive gate contacts (not shown) can also be formed in the ILD 152 to extend through the top spacer 150 and directly contact the gate structure 146 to provide electrical access thereto.

The contact vias and/or the gate contacts can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotubes, conductive carbon, graphene, or any suitable combination of these materials. The conductive material can further include dopants that are incorporated during or after deposition.

In some embodiments of the present invention, the contacts can be copper or tungsten and can include a barrier metal liner (not shown). The barrier metal liner prevents the copper or tungsten from diffusing into, or doping, the surrounding materials, which can degrade their properties. Silicon, for example, forms deep-level traps when doped with copper. An ideal barrier metal liner must limit the bulk metal diffusivity sufficiently to chemically isolate the conductor from the surrounding materials and should have a high electrical conductivity, for example, tantalum, tantalum nitride, titanium, titanium nitride, cobalt, ruthenium, manganese, or titanium carbide.

In some embodiments of the present invention, the vias include a metal (e.g., titanium) that reacts with semiconductor materials (e.g., the top source/drains 150) to form a silicide film (not shown) between the top source/drains 150 and the contact vias. As the silicide film is only formed at the interface between the vias and the top source drains 150, the silicide film can be said to be self-aligned to the top source/drains 150 (a self-aligned silicide is also referred to as a salicide).

The fabrication operations described above provide a VFET semiconductor device 200 that includes an STI element 140 having a bottleneck cross-sectional profile. The STI element 140, however, can have a different cross-sectional profile without departing from the scope of the invention.

Figure 14:
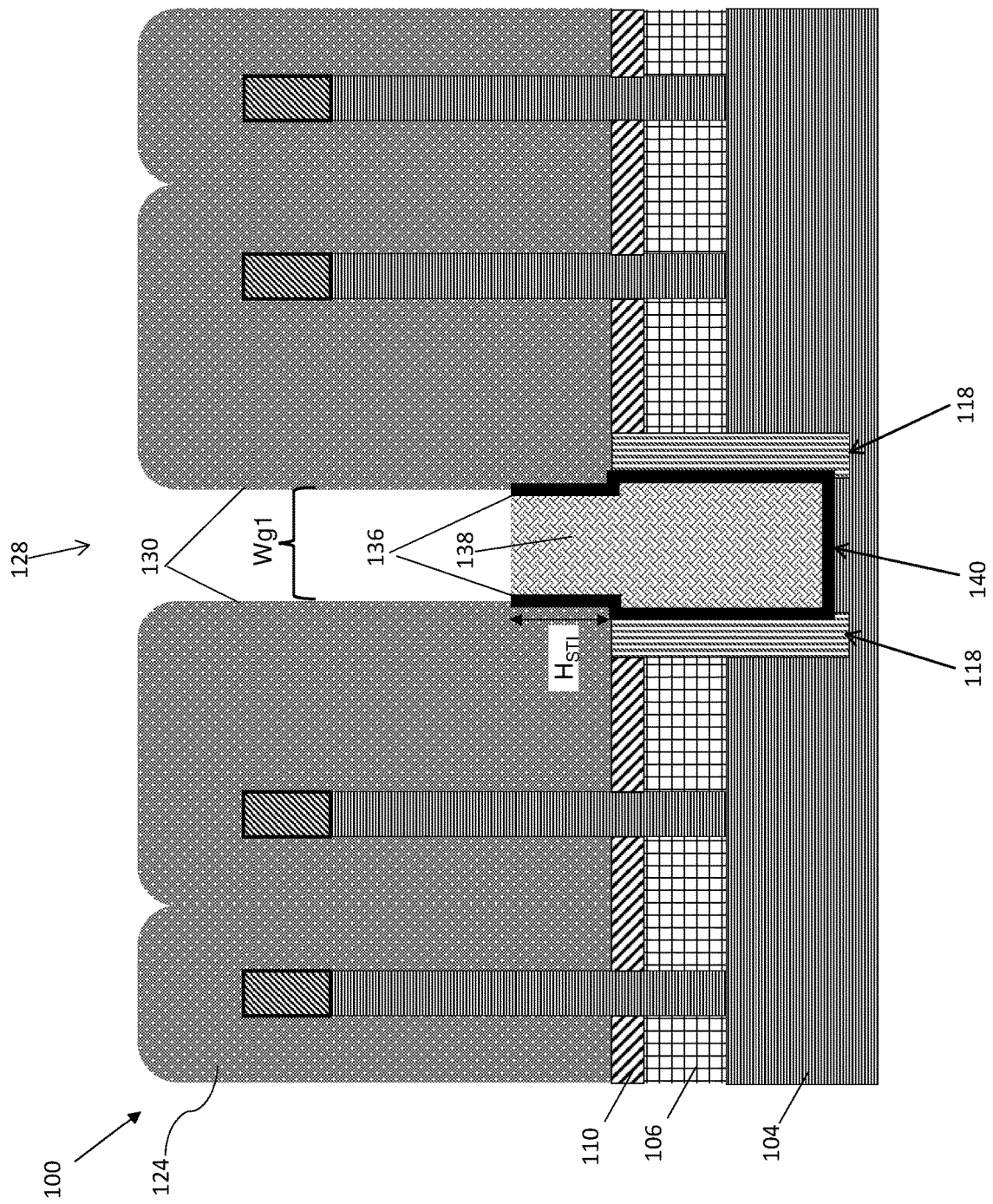
FIG. 14 depicts the semiconductor device after filling the isolation trench with a shallow trench isolation material according to a non-limiting embodiment of the invention.

Turning to FIG. 14, for example, the intermediate semiconductor device 100 is illustrated after partially etching the trench liner 136 and trench dielectric material 138 deposited in the gap 128. The trench liner 136 and trench dielectric material 138 can be etched using similar etching processes described with respect to FIG. 11.

Figure 15:
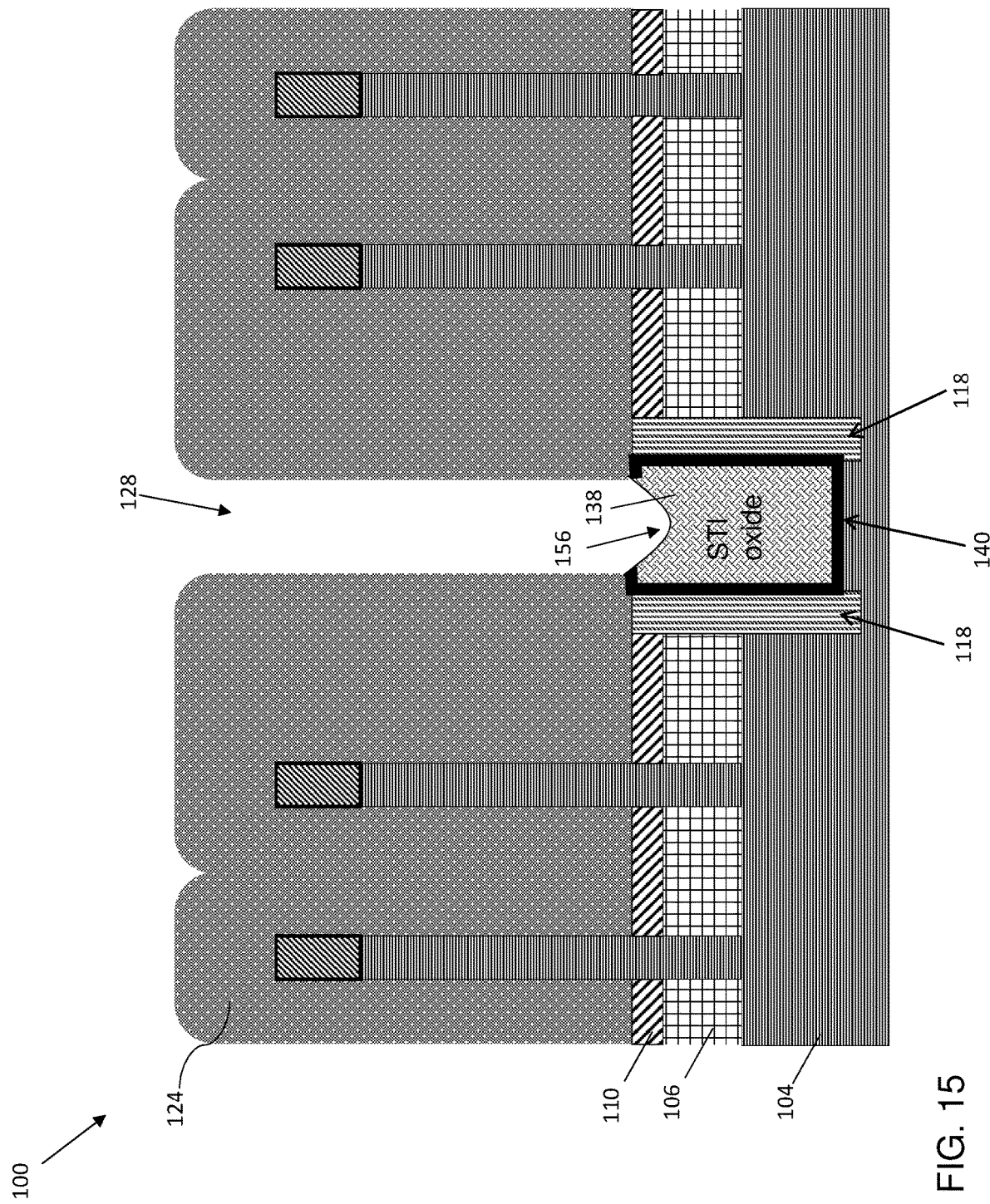
FIG. 15 depicts the semiconductor device after recessing the shallow trench isolation material below the bottom spacer according to a non-limiting embodiment of the invention.

At FIG. 15, semiconductor device 100 is illustrated after continuing the etching process so that an upper surface of trench dielectric material 138 is flush with the trench liner 136 and upper surface of the trench spacers 118. In other embodiments of the invention, the upper surface of the trench dielectric material 138 extends no higher than the upper surface of the trench liner 136. The trench dielectric material 138 can also be recessed so that it is below both the trench liner 136 and the upper ends of the trench spacers 118. In one or more embodiments of the invention, the upper surface of the STI element 140 includes a divot 156 that extends into the trench dielectric material 138, and below the trench liner 136 and upper ends of the trench spacers 118.

Figure 16:
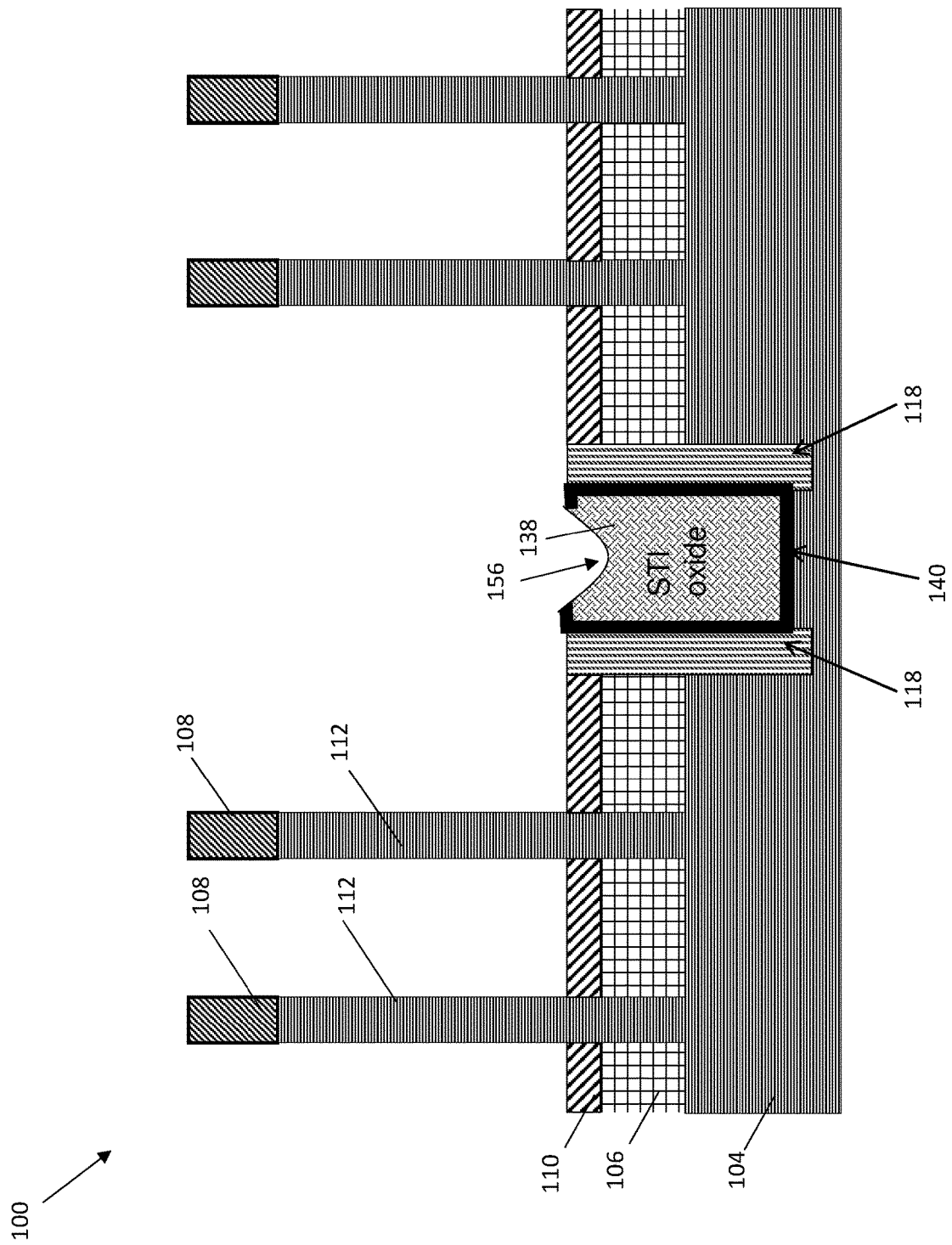
FIG. 16 depicts the semiconductor device after removing the sacrificial spacer material to form a shallow trench isolation element having a concave profile according to a non-limiting embodiment of the invention.

Turning to FIG. 16, the semiconductor device 100 is illustrated following removal of the sacrificial spacer material 124, which can be removed using an oxygen-based plasma etching process. Accordingly, a shallow trench isolation (STI) element 140 having a concaved cross-sectional profile is formed in the isolation region 115 and between the trench spacers 118. The divot 156 extends from the upper surface of the STI element 140, into the dielectric material 138 and below the upper ends of the trench spacers 118.

Figure 17:
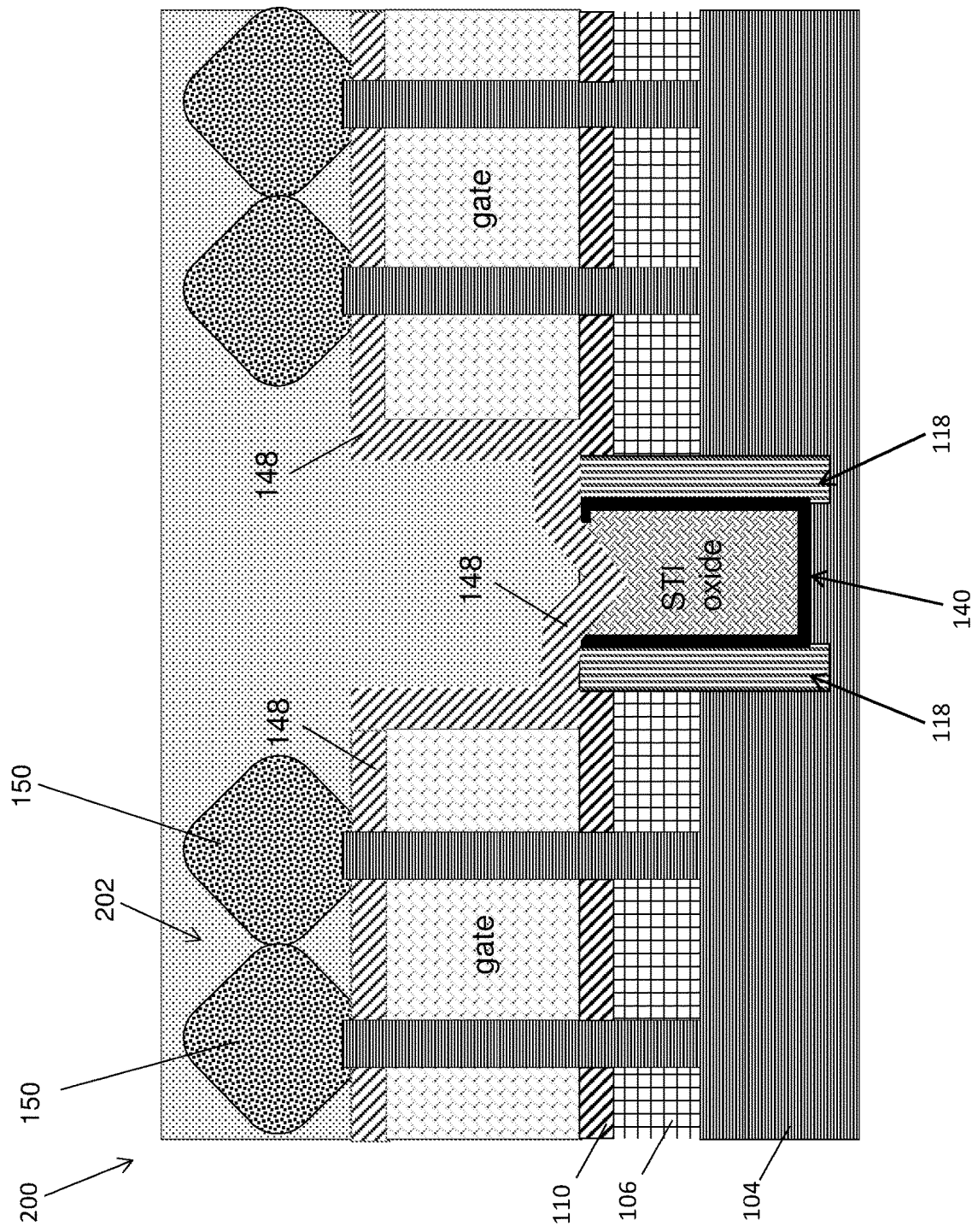
FIG. 17 depicts a completed semiconductor device including the STI element having been formed without recessing the bottom source/drain region and the bottom spacer according to a non-limiting embodiment of the invention.

At FIG. 17, a completed VFET semiconductor device 200 is illustrated. The VFET semiconductor device 200 includes one or more gate structures 146, a top spacer 148, top source/drains 150, and an inter-level dielectric (ILD) 152. The divot 156 causes the bottom spacer 110 to be formed with a V-shaped portion that extends into the trench dielectric material 138 of the STI element 140.

As described herein, various non-limiting embodiments provide a VFET semiconductor device including a STI element formed between a pair of VFETs. Unlike conventional VFET semiconductor devices, the VFET semiconductor device described herein employs trench spacers, which allows formation of the STI without recessing the bottom source/drain region and the bottom spacer. In this manner, all the VFETs included in fabricated semiconductor device have a uniform bottom source/drain region and spacer, thereby reducing device variability while also avoiding process variations to improve device yield.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device having a dummy fin removed from within an array of tight pitch fins according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," "slightly less than," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop. The term "conformal" (e.g., a conformal layer) means that the thickness of the layer is substantially the same on all surfaces, or that the thickness variation is less than 15% of the nominal thickness of the layer.

Aspects of the present invention are described herein with reference to flowchart illustrations and/or block diagrams of methods, and apparatus (devices) products according to embodiments of the invention. The flowchart and block diagrams in the Figures illustrate the architecture, functionality, and operation of possible implementations of the device and method of fabricating the device according to various embodiments of the present invention. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or a unique combination of fabrication operations to fabricate the semiconductor device.

The present invention can be a device and/or method of fabricating the device at any possible technical detail level of integration. The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:
1. A semiconductor device comprising:
a substrate including a first semiconductor fin and a second semiconductor fin separated from the first semiconductor fin by an isolation region;
a pair of opposing dielectric trench spacers in a portion of the substrate located in the isolation region between the first and second semiconductor fins; and
a shallow trench isolation (STI) element comprising a trench dielectric material formed in the isolation region, the STI element including an upper surface that extends no higher than an upper end of the opposing dielectric trench spacers, wherein the STI element includes a trench liner interposed between the trench dielectric material and the opposing dielectric spacers, and wherein the opposing dielectric trench spacers are discrete from one another.

2. The semiconductor device of claim 1, wherein the upper surface of the STI element includes a divot that extends into the trench dielectric material and below both the trench liner and upper ends of the opposing dielectric trench spacers.

3. The semiconductor device of claim 2 further comprising a top spacer formed on an upper surface of the STI element, the top spacer including a V-shaped portion that extends into the divot.

4. The semiconductor device of claim 3, wherein the trench liner is formed on sidewalls of the trench dielectric material, along with a base of the trench dielectric material.

5. The semiconductor device of claim 4 further comprising:
   a bottom source or drain (S/D) region formed on an upper surface of the substrate; and
   a bottom spacer formed on an upper surface of the S/D region, wherein an upper surface of the bottom spacer is flush with the upper end of the dielectric trench spacers.

6. The semiconductor device of claim 5, wherein the opposing dielectric trench spacers are formed directly against each of the substrate, the bottom S/D region, and the bottom spacer.

* * * * *